(12) United States Patent
Tsai

(10) Patent No.: US 7,554,802 B2
(45) Date of Patent: Jun. 30, 2009

(54) DUSTPROOF MEMBER FOR MEMORY CARD SLOT

(75) Inventor: Tung-Chi Tsai, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 51 days.

(21) Appl. No.: 11/935,365

(22) Filed: Nov. 5, 2007

(65) Prior Publication Data

US 2009/0021906 A1 Jan. 22, 2009

(30) Foreign Application Priority Data

Jul. 20, 2007 (CN) .......................... 2007 1 0201140

(51) Int. Cl.
*H05K 7/00* (2006.01)

(52) U.S. Cl. .................. 361/685; 361/679.33; 720/646; 439/137

(58) Field of Classification Search ............... 439/137, 439/892; 402/40, 73; 720/646, 648; 600/136, 600/152; 235/449, 487; 361/679.33, 685
See application file for complete search history.

(56) References Cited

U.S. PATENT DOCUMENTS

| 6,339,491 | B1 | 1/2002 | Kondou et al. | |
|---|---|---|---|---|
| 2002/0058432 | A1* | 5/2002 | Chen et al. | 439/142 |
| 2007/0115259 | A1* | 5/2007 | Pai | 345/163 |
| 2008/0268725 | A1* | 10/2008 | Kuo et al. | 439/892 |

\* cited by examiner

*Primary Examiner*—Hung V Duong

(57) ABSTRACT

A dustproof member for a memory card slot includes a housing provided with an inserting slot for receiving the card, a cover including a main body for covering the inserting slot, the main body comprising a pivotal side pivotally assembled with the housing and a rotary side opposed to the pivotal side, and at least one spring. The rotary side can rotate about the pivotal side when the card is inserted in or withdrawn, and the spring applies elastic force on the cover for pushing the cover to a station covering the inserting slot.

9 Claims, 4 Drawing Sheets

DUSTPROOF MEMBER FOR MEMORY CARD SLOT

TECHNICAL FIELD

The present invention relates to a dustproof member and, particularly, to a dustproof member for a memory card slot configured for preventing dust getting into digital electronic devices during memory cards insertion into the digital electronic devices.

BACKGROUND

With rapid developments in the electronic industry, various electronic devices have become widely used, such as digital cameras. Digital cameras usually use removable digital cards to store pictures. While in use, the cards should be inserted into the cameras. Accordingly, an inserting slot is used in a camera for receiving the card. However, conventional inserting slots are exposed to the outside. Dust or other contamination can enter into the slot, even the inner space of the camera, which can affect the data transfer between the card and the camera. Rubber covers are commonly used to protect the slot from dust. However, it is not convenient for a user to insert a card because the rubber cover must be removed before the card is inserted and replaced once the card is removed.

There is a heretofore unaddressed need in the industry to provide a convenient dustproof member to prevent dust getting into electronic devices.

SUMMARY

In accordance with a present embodiment, A dustproof member for a memory card slot includes a housing provided with an inserting slot for receiving a memory card, a cover including a main body for covering the inserting slot, the main body comprising a pivotal side pivotably assembled with the housing and a rotary side opposite to the pivotal side, and at least one spring. The rotary side can rotate about the pivotal side when the card is inserted in or withdrawn, and the spring applies elastic force on the cover for pushing the cover to a station covering the inserting slot.

Other objects, advantages and novel features of the invention will become more apparent from the following detailed description when taken in conjunction with the accompanying drawings, in which:

BRIEF DESCRIPTION OF THE DRAWINGS

Many aspects of the present packaging structure can be better understood with reference to the following drawings. The components in the drawings are not necessarily drawn to scale, the emphasis instead being placed upon clearly illustrating the principles of the present dustproof member for memory card slot. Moreover, in the drawings, like reference numerals designate corresponding parts throughout the several views.

DESCRIPTION OF EMBODIMENTS

Embodiments of the present dustproof member for memory card slot will now be described in detail below with reference to the drawings.

Figure 1:
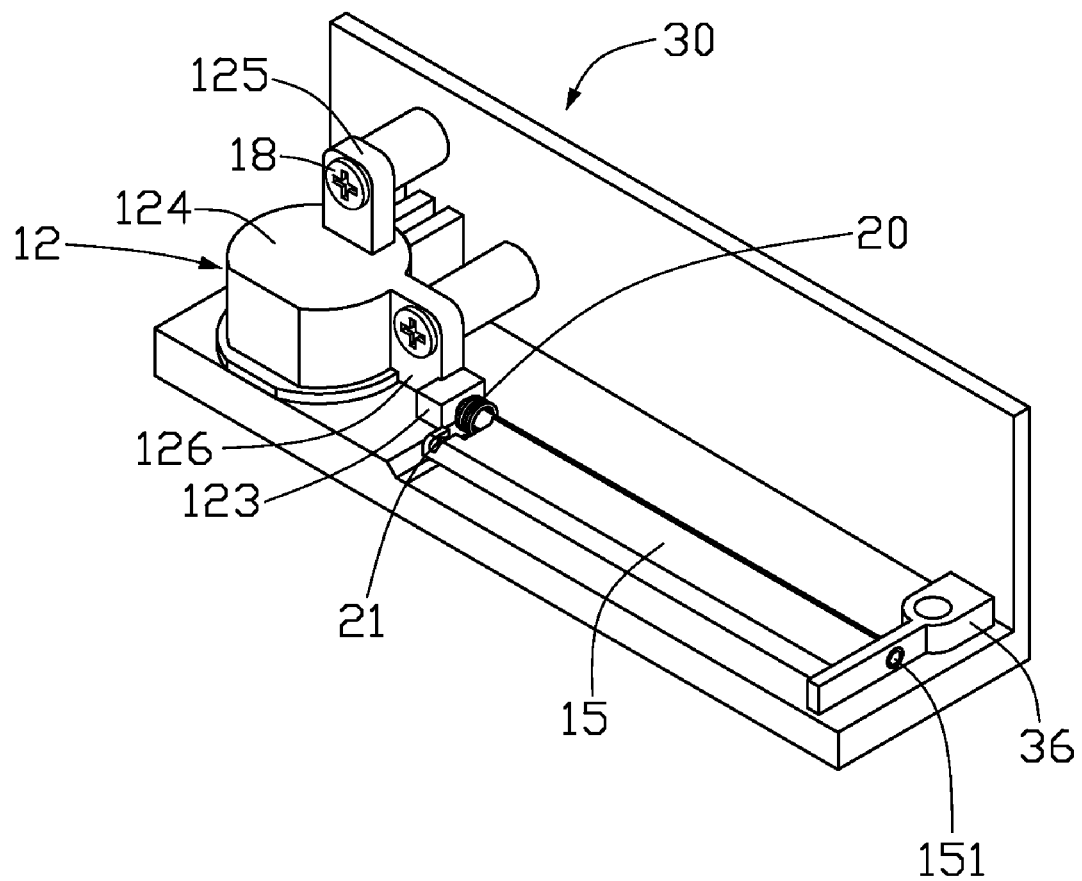
FIG. 1 is an isometric view of a dustproof member for a memory card slot in accordance with a first embodiment of the present invention.
Figure 2:
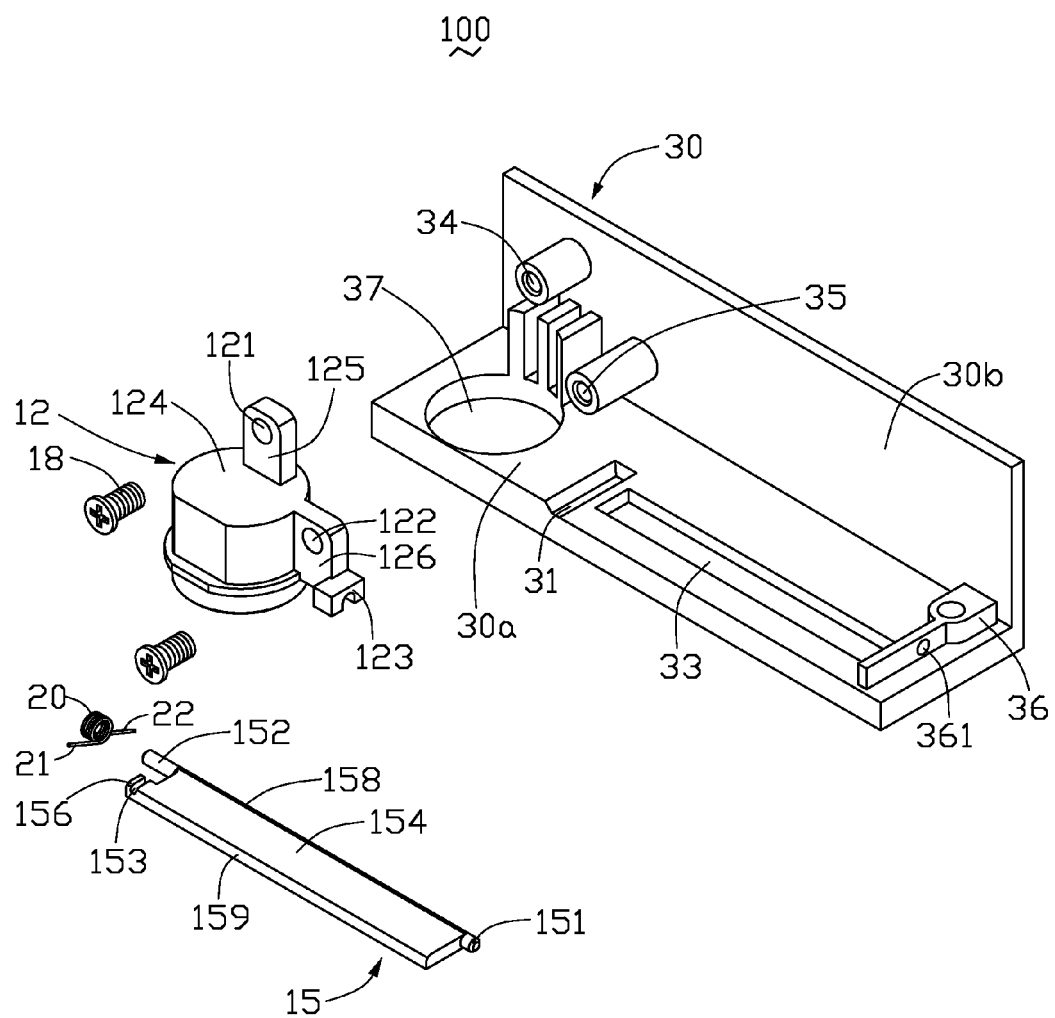
FIG. 2 is exploded view of FIG. 1.
Figure 3:
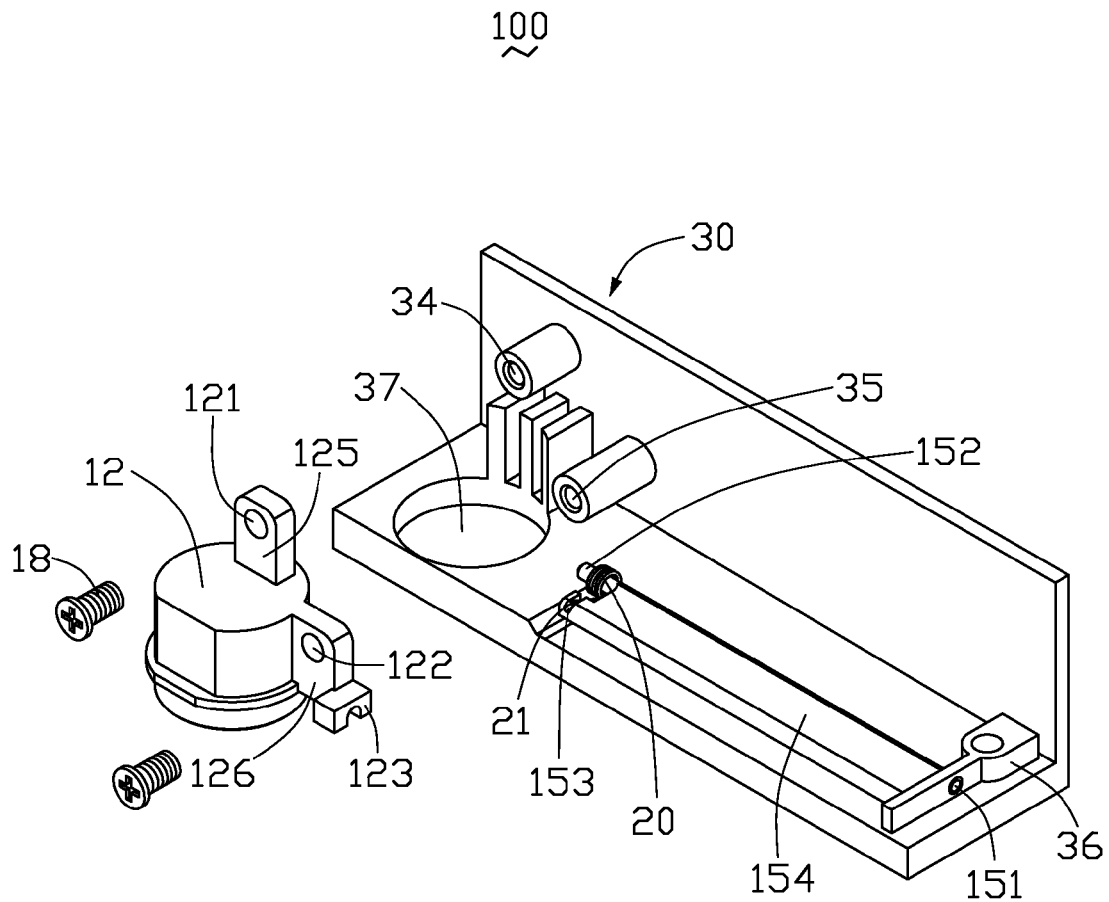
FIG. 3 is a partially assembled view of the dustproof member of the first embodiment.

Referring to FIGS. 1-3, a dustproof member 100 for a memory card slot in accordance with a first preferred embodiment includes a housing 30, a cover 15, a spring 20, and a fastening seat 12.

The housing 30 has an L-shaped configuration and includes a base wall 30a and a sidewall 30b perpendicularly extending upward from a side of the base wall 30a. The rectangular base wall 30a comprises a fastening member 36 formed near one narrow end thereof, an aperture 37 defined therein near the other narrow end thereof, a housing recess 31 formed on the middle top portion thereof adjacent the aperture 37, and an inserting slot 33 formed between the housing recess 31 and the fastening member 36. The fastening member 36 further defines a shaft hole 361. The fastening member 36 and the housing recess 31 are located at opposite ends of the inserting slot 33, respectively, with the housing recess 31 being at the end nearest the aperture 37. The inserting slot 33 is configured to allow a memory card to be inserted thereinto. The sidewall 30b includes a first screw hole 34 formed at a portion away from the base wall 30a aligned with the aperture 37, and a second screw hole 35 formed at a lower portion thereof adjacent the base wall 30a.

The cover 15 is rectangular-shaped and has an area substantially equal to or a little greater than that of the inserting slot 33, corresponding to the shape, size, and position of the inserting slot 33. The cover 15 is pivotably assembled at the internal side of the base wall 30b, to cover the inserting slot 33. The cover 15 includes a main body 154 for covering the inserting slot 33, a pivotal side 158, and a rotary side 159 opposite to the pivotal side 158. The pivotal side 158 further defines a first shaft 151 extending laterally and pivotably supported in the shaft hole 361, and a second shaft 152 extending away from the first shaft 151. The rotary side 159 defines a protrusion 156 adjacent the second shaft 152. The protrusion 156 defines a cover recess 153. It is noted that the first and second shafts 151, 152 are coaxial.

The spring 20 includes a free end 21 and a fastening end 22. The spring 20 sleeves the second shaft 152 with the free end 21 received in the cover recess 153 for abutting against the bottom of the cover recess 153. The fastening end 22 is received in the housing recess 31. The free end 21 can rotate with the rotary side 159 when the memory card slot is inserted in or withdrawn. The spring 20 is used for providing elastic force to push the cover 15 to return to an original position when the memory card slot is not inserted. In fact, the spring can be other elastic members, such as rubber strip.

The fastening seat 12 is partially fastened in the aperture 37, and defines a fastening portion 124 with an internal thread for engaging with an external thread of an external digital device. The fastening portion 124 defines a first projecting block 125 provided with a first screw bore 121. The fastening portion 124 defines a second projecting block 126 provided with a second screw bore 122. The second projecting portion 126 defines a fixing portion 123 to pivotally cooperate with the corresponding second shaft 152.

Assembling steps of the dustproof member will be described in detail. The cover 15 is placed on the basewall 30a to cover the inserting slot 33. The first shaft 151 of the cover 15 is firstly supported in the shaft hole 361, and the spring 20 is then assembled with the second shaft 152. The free end 21 is received in the cover recess 153 to abut against the bottom of the cover recess 153, while the fastening end 22 is received in the housing recess 31. After that, the fastening seat 12 is partially received in the aperture 37 of the housing 30 with the fixing portion 123 engaged with the second shaft 152. The fastening seat 12 is mounted on the housing 30 by cooperation between a screw 18 and the sub-assembly of the first screw bore 121 with the first screw hole 34, and cooperation between another screw 18 and the sub-assembly of the second screw bore 122 with the second screw hole 35.

Figure 4:
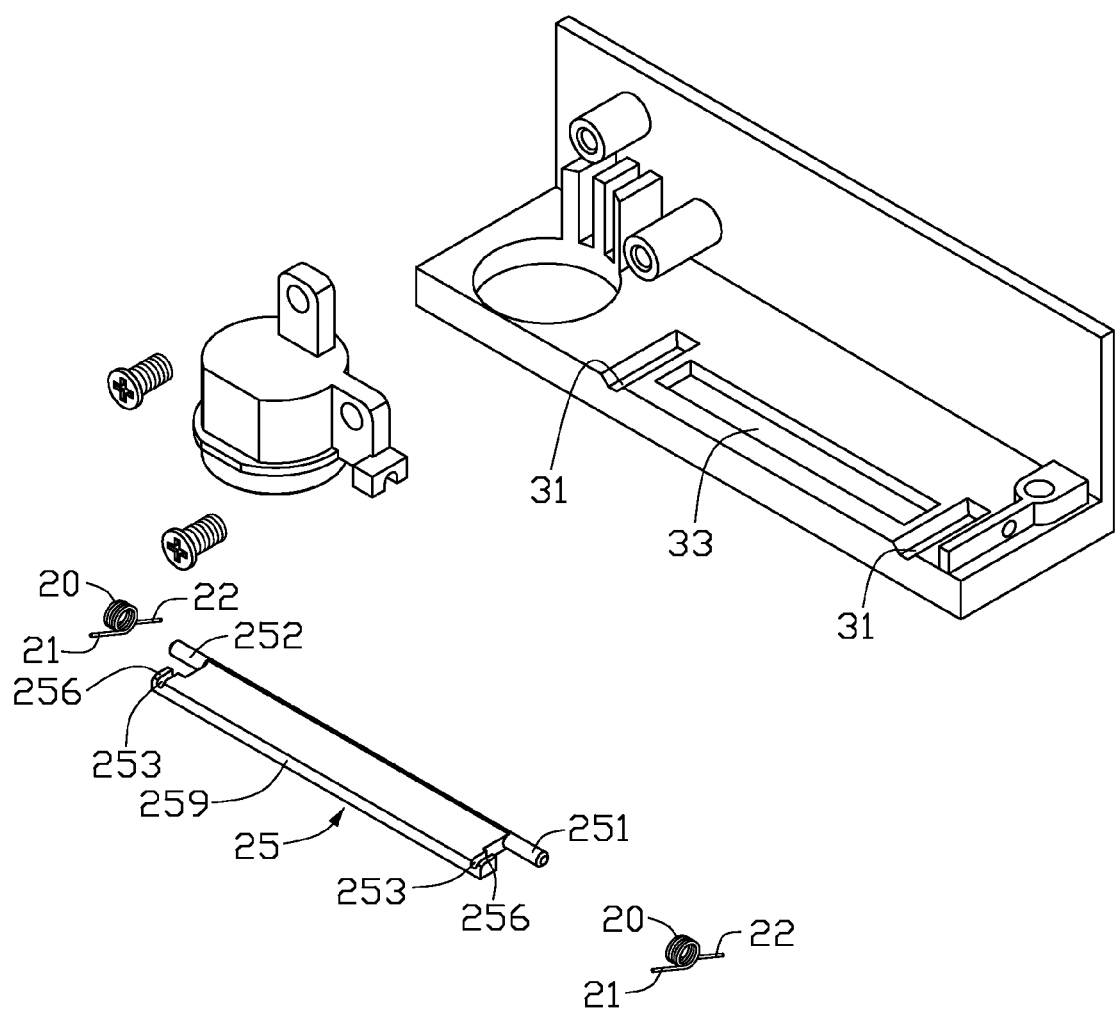
FIG. 4 is an isometric view of a dustproof member for a memory card slot in accordance with a second embodiment of the present invention.

Referring to FIG. 4, a dustproof member 200, in accordance with a second preferred embodiment of the invention, is shown. The dustproof member 200 is similar to the dustproof 100 of the first embodiment. In this embodiment, the rotary side 259 of the cover 25 defines a pair of protrusions 256 at two opposite ends thereof. Each of the protrusions 256 defines two cover recesses 253 to receive the free ends 21 of two springs 20 and make the free ends 21 abut against the bottoms thereof, respectively. The springs 20 are provided to respectively engage with the first and second shafts 251, 252. Accordingly, a pair of housing recesses 31 is provided to respectively receive the fastening ends 22 of the springs 20. Obviously, the additional spring 20 cooperates with the additional housing recess 31 and the cover recess 253 in the same manner as the single spring 20 and the single recess 153 of the first embodiment. Other configurations of the second embodiment are the same as that of the first embodiment, and so are not described in detail.

In fact, the shaft and the shaft hole are complementary to each other. Therefore, positions thereof can be interchanged. For example, the first shaft can be defined on the fastening member while the shaft hole can be defined in the cover. The second shaft and the fixing portion can also be interchanged.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A dustproof member for a memory card slot comprising:
   a housing provided with an inserting slot for receiving a memory card therein;
   a cover including a main body configured to cover the inserting slot, the main body comprising a connecting side pivotably assembled with the housing and a free side opposite to the connecting side;
   at least one spring connected between the cover and the housing; wherein
   the free side is capable of rotating about the connecting side to expose the inserting slot to thereby allow the card to be inserted in the inserting slot or withdrawn from the inserting slot, and the at least one spring applies elastic force on the cover for pushing the cover to cover the inserting slot.

2. The dustproof member for a memory card slot as described in claim 1, further including a fastening member, a housing recess, and a fastening seat, wherein the fastening member and the housing recess are located at two opposite ends of the inserting slot, respectively, the fastening member and the fastening seat cooperatively pivotably attach the connecting side of the cover to the housing.

3. The dustproof member for a memory card slot as described in claim 2, wherein the connecting side defines a first shaft extending laterally and a second shaft coaxial to the first shaft and extending away from the first shaft, the fastening member defines a shaft hole for pivotably receiving the first shaft, and the fastening seat defines a fixing portion cooperating with the second shaft.

4. The dustproof member for a memory card slot as described in claim 3, wherein the free side of the cover defines a protrusion adjacent the second shaft, the protrusion defining a cover recess therein, the at least one spring being a torsional spring sleeving the second shaft, the torsional spring having two ends, one end of the torsional spring being received in the housing recess and the other end being received in the cover recess.

5. The dustproof member for a memory card slot as described in claim 3, wherein the at least one spring comprises a pair of torsional springs sleeving the first shaft and the second shaft, respectively, another housing recess being defined in the housing, the free side of the cover defining a pair of cover recesses, each of the torsional springs having two ends, one end of each of the torsional springs being received in one of the cover recesses and the other end being received in one corresponding housing recess.

6. The dustproof member for a memory card slot as described in one of claims 5, wherein the housing defines an aperture corresponding to the fastening seat for restricting the fastening seat.

7. The dustproof member for a memory card slot as described in one of claims 6, wherein the fastening seat is provided with an internal thread for engaging with an external thread of an external digital device.

8. The dustproof member for a memory card slot as described in one of claims 7, further including a pair of screws for fixing the fastening seat with the housing.

9. The dustproof member for a memory card slot as described in claim 2, wherein the connecting side defines two shaft holes while the fastening member and the fastening seat each defines a shaft corresponding to the shaft holes.

* * * * *